(12) United States Patent
Huang et al.

(10) Patent No.: US 11,476,191 B2
(45) Date of Patent: Oct. 18, 2022

(54) LOW RESISTANCE INTERCONNECT STRUCTURE FOR SEMICONDUCTOR DEVICE

(71) Applicant: Taiwan Semiconductor Manufacturing Co., Ltd., Hsinchu (TW)

(72) Inventors: Jason Huang, Hsinchu (TW); Liang-Chor Chung, Hsinchu (TW); Cheng-Yuan Li, Kaohsiung (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/940,034

(22) Filed: Jul. 27, 2020

(65) Prior Publication Data

US 2021/0193565 A1    Jun. 24, 2021

Related U.S. Application Data

(60) Provisional application No. 62/949,636, filed on Dec. 18, 2019.

(51) Int. Cl.
| *H01L 23/528* | (2006.01) |
| *H01L 21/768* | (2006.01) |
| *H01L 21/02* | (2006.01) |
| *H01L 21/285* | (2006.01) |

(52) U.S. Cl.
CPC ...... *H01L 23/528* (2013.01); *H01L 21/02178* (2013.01); *H01L 21/28562* (2013.01); *H01L 21/7685* (2013.01); *H01L 21/76804* (2013.01); *H01L 21/76834* (2013.01)

(58) Field of Classification Search
None
See application file for complete search history.

(56) References Cited

U.S. PATENT DOCUMENTS

| 10,177,028 | B1 * | 1/2019 | LiCausi | H01L 21/76834 |
| 2011/0058302 | A1 * | 3/2011 | Valcore, Jr. | H01L 21/6831 361/234 |
| 2016/0365271 | A1 * | 12/2016 | Chang | H01L 21/76811 |
| 2019/0326296 | A1 * | 10/2019 | Wang | H01L 23/528 |
| 2020/0075426 | A1 * | 3/2020 | Schmid | G01N 33/582 |

* cited by examiner

*Primary Examiner* — Alexander G Ghyka
(74) *Attorney, Agent, or Firm* — Sterne, Kessler, Goldstein & Fox P.L.L.C.

(57) ABSTRACT

The present disclosure describes an interconnect structure and a method forming the same. The interconnect structure can include a substrate, a layer of conductive material over the substrate, a metallic capping layer over the layer of conductive material, a layer of insulating material over top and side surfaces of the metallic capping layer, and a layer of trench conductor formed in the layer of insulating material and the metallic capping layer.

20 Claims, 13 Drawing Sheets

LOW RESISTANCE INTERCONNECT STRUCTURE FOR SEMICONDUCTOR DEVICE

CROSS-REFERENCE TO RELATED APPLICATION

This application claims the benefit of U.S. Provisional Patent Application No. 62/949,636, titled "Low Resistance Metal Interconnect," which was filed on Dec. 18, 2019 and is incorporated herein by reference in its entirety.

BACKGROUND

Advances in semiconductor technology have increased the demand for semiconductor devices with higher storage capacity, faster processing systems, higher performance, and lower costs. To meet these demands, the semiconductor industry continues to scale down the dimensions of semiconductor devices, such as planar metal oxide semiconductor field effect transistors (MOSFETs), fin field effect transistors (finFETs), and nano-sheet field effect transistors (NSFETs). Such scaling down has increased the complexity of semiconductor device manufacturing processes.

BRIEF DESCRIPTION OF THE DRAWINGS

Aspects of this disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1A:
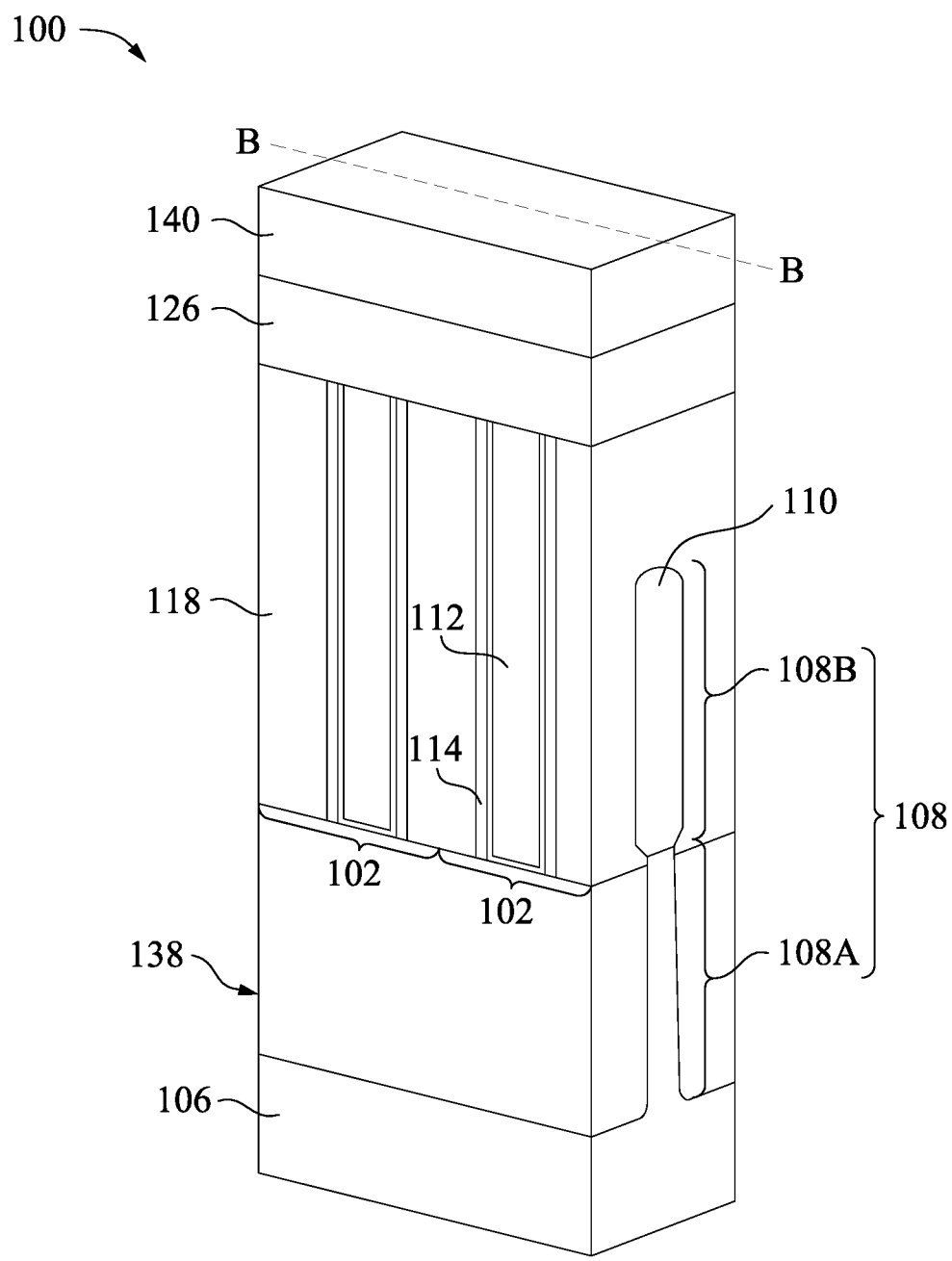
FIG. 1A illustrates an isometric view of a semiconductor device, according to some embodiments.
Figure 1A:
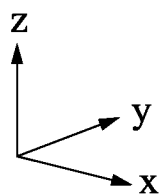

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, ±2%, ±3%, ±4%, and ±5% of the target value).

As used herein, the term "vertical," means nominally perpendicular to the surface of a substrate.

As used herein, the term "insulating layer", refers to a layer that functions as an electrical insulator (e.g., a dielectric layer).

As used herein, the term "selectivity" refers to the ratio of the etch rates of two materials under a same etching condition.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

Fins associated with fin field effect transistors (finFETs) or gate-all-around (GAA) FETs may be patterned by any suitable method. For example, the fins may be patterned using one or more photolithography processes, including double-patterning or multi-patterning processes. Double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Technology advances in the semiconductor industry drive the pursuit of integrated circuits (IC)s having higher device density, higher performance, and lower cost. In the course of the IC evolution, the interconnect structure is scaled down to achieve ICs with higher device densities. With the miniaturization of the interconnect structure, the current density in the metal lines of the interconnect structure increases. Such current density increasing can cause the IC failure due to electromigration. To reconcile the electromigration, each metal line of the interconnect structure can be covered by a metallic capping layer to reduce the migration of metallic atoms in each metal line. However, such metallic capping layer can introduce extra resistance between different layers of the interconnect structure, thus degrading the performance of the IC.

The present disclosure is directed to a fabrication method and an interconnect structure that provides low resistance and diminishes electromigration. For example, the interconnect structure can include a metal wire, a metallic capping layer formed over the metal wire, and a via conductor layer formed through the metallic capping layer. The metallic capping layer can reconcile the electromigration associated with the metal wire. The via conductor can contact the metal wire by removing portions of the metallic capping layer between the metal wire and the via conductor layer. Accordingly, the contact resistance between the via conductor layer and the metal wire can be reduced. In some embodiments, the interconnect structure can further include an insulating layer formed over the metal wire and the metallic capping layer, where the via conductor layer can be formed through the insulating layer and the metallic capping layer to contact the metal wire. A benefit of the present disclosure, among others, is to lower the resistance and the signal delay (e.g., RC delay) in the interconnect structure, thus enhancing an overall performance and yield of the IC.

Figure 1B:
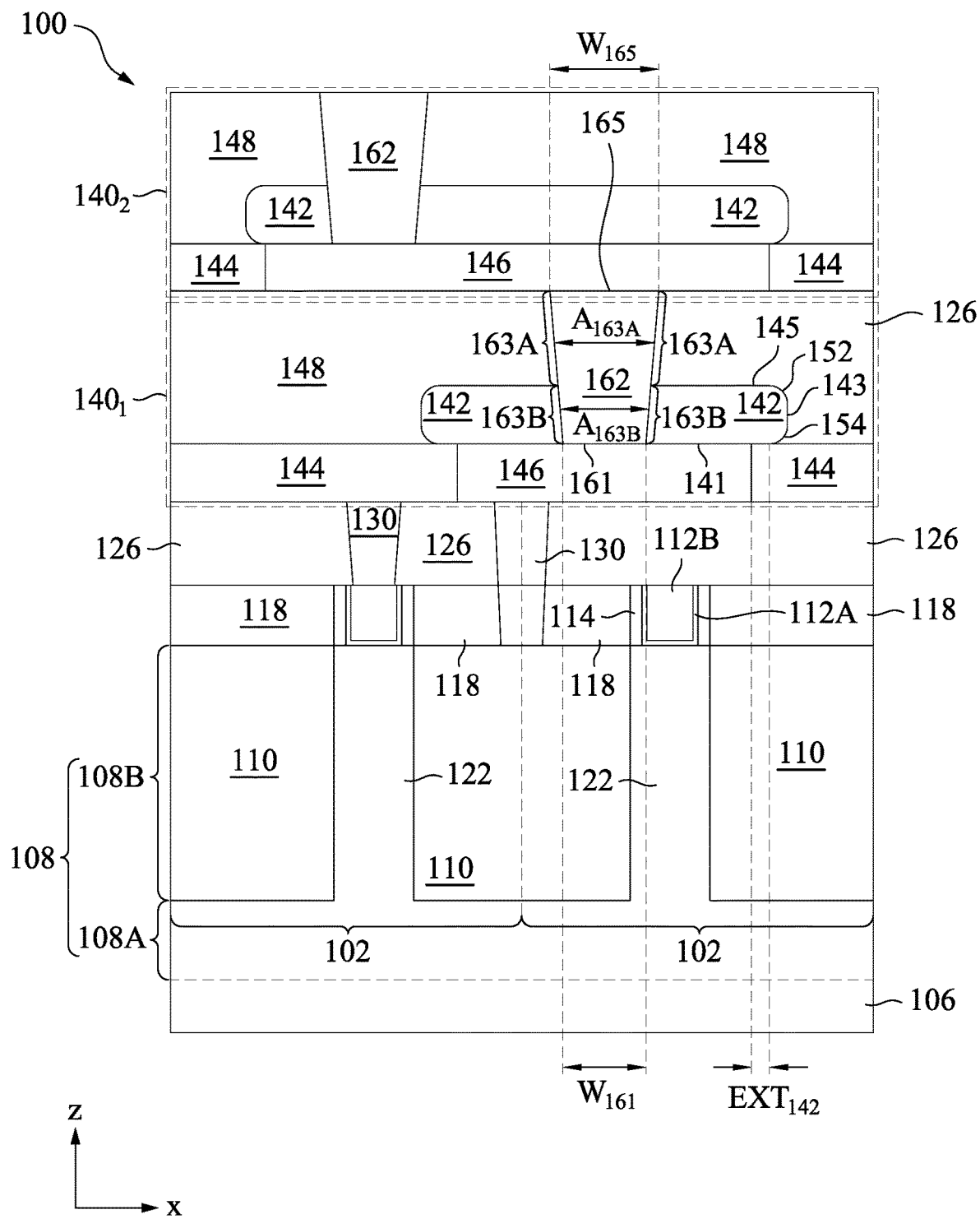
FIG. 1B illustrates a cross-sectional view of a semiconductor device, according to some embodiments.

A semiconductor device 100 having multiple field effect transistors (FETs) 102 and one or more interconnect structure 140 (e.g., interconnect structure 140$_1$ and 140$_2$) disposed over FETs 102 is described with reference to FIGS. 1A and 1B, according to some embodiments. FIG. 1A illustrates an isometric view of semiconductor device 100, according to some embodiments. FIG. 1B illustrates a cross-sectional view along line B-B of semiconductor device 100 of FIG. 1A, according to some embodiments. Semiconductor device 100 can be included in a microprocessor, memory cell, or other integrated circuit. Though FETs 102 shown in FIGS. 1A and 1B are fin field effect transistors (finFETs), each FET 102 can be a gate-all-around (GAA) FET, according to some embodiments.

Referring to FIG. 1A, each FET 102 can include a fin structure 108 extending along an x-axis, a gate structure 112 traversing through fin structure 108 along an y-axis, and a source/drain (S/D) region 110 formed over portions of fin structure 108. Although FIG. 1A shows fin structure 108 accommodating two FETs 102, any number of FETs 102 can be disposed along fin structure 108. Each FET 102 can be formed on a substrate 106. Substrate 106 can be a semiconductor material, such as silicon. In some embodiments, substrate 106 can include (i) an elementary semiconductor, such as silicon (Si) and germanium (Ge); (ii) a compound semiconductor including silicon carbide (SiC), gallium arsenide (GaAs), gallium phosphide (GaP), indium phosphide (InP), indium arsenide (InAs), and indium antimonide (InSb); or (iii) a combination thereof. Further, substrate 106 can be doped depending on design requirements (e.g., p-type substrate or n-type substrate). In some embodiments, substrate 106 can be doped with p-type dopants (e.g., boron (B), indium (In), aluminum (Al), or gallium (Ga)) or n-type dopants (e.g., phosphorus (P) or arsenic (As)).

Semiconductor device 100 can further include shallow trench isolation (STI) regions 138 that provide electrical isolation for fin structure 108. For example, STI regions 138 can electrically isolate fin structure 108 from another fin structure 108 (not shown in FIG. 1A) formed in semiconductor device 100. Also, STI regions 138 can provide electrical isolation between FETs 102 and neighboring active and passive elements (not shown in FIG. 1A) integrated with or deposited on substrate 106. STI regions 138 can include one or more layers of dielectric material, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials.

Referring to FIGS. 1A and 1B, fin structure 108 can include a fin base portion 108A and a stacked fin portion 108B disposed on fin base portion 108A. Fin base portion 108A can include a material identical to or similar to substrate 106, such as a material having a lattice constant substantially close to (e.g., lattice mismatch within 5%) that of substrate 106. Stacked fin portion 108B can include a semiconductor layer 122 functioning as FET 102's channel layer 122 and a S/D region 110 horizontally (e.g., in the x-direction) in contact with channel layer 122.

Referring to FIG. 1B, S/D region 110 can be grown over fin base portion 108A. Each of channel layers 122 of FET 102 can be interposed between a pair of S/D regions 110. S/D region 110 can include an epitaxially-grown semiconductor material. In some embodiments, the epitaxially grown semiconductor material can be the same material as the material of substrate 106. For example, the epitaxially-grown semiconductor material can have a lattice constant substantially close to (e.g., lattice mismatch within 5%) that of the material of substrate 106. In some embodiments, the epitaxially-grown semiconductor material can include: (i) a semiconductor material, such as Ge and Si; (ii) a compound semiconductor material, such as GaAs and AlGaAs; or (iii) a semiconductor alloy, such as SiGe and GaAsP. S/D region 110 can be doped with p-type dopants or doped with n-type dopants. The p-type dopants can include B, In, Al, or Ga. The n-type dopants can include P or As. In some embodiments, S/D region 110 can include a silicide layer (not shown in FIGS. 1A and 1B). The silicide layer can include metal silicide that can provide a low resistance interface between the underlying S/D region 110 and the trench conductor layer 130.

Channel layer 122 can include semiconductor materials similar to substrate 106. For example, channel layer 122 can include a semiconductor material having lattice constant substantially close to (e.g., lattice mismatch within 5%) that of substrate 106. In some embodiments, channel layer 122 can include Si or SiGe. In some embodiments, channel layer 122 can include SiGe with a Ge concentration from about 25 atomic percent to about 50 atomic percent with any remaining atomic percent being Si or can include Si without any substantial amount of Ge. In some embodiments, channel layer 122 can be undoped, doped with p-type dopants or doped with n-type dopants. The p-type dopant can include B, In, Al, or Ga. The n-type dopant can include P or As.

Gate structure 112 can be multi-layered structures that wraps around portions of fin structure 108. For example, gate structure 112 can wrap FET 102's channel layers 122 (e.g., semiconductor layer 122) to modulate a conductivity of FET 102's channel layer 122. In some embodiments, gate structure 112 can be referred to as gate-all-around (GAA) structures, where FET 102 can be referred to as a GAA FET 102. Gate structure 112 can include a gate dielectric layer 112A, a gate electrode 112B disposed on gate dielectric layer 112A, and gate spacers 114 disposed on sidewalls of gate electrode 112B. Gate dielectric layer 112A can be wrapped around channel layer 122, hence electrically isolating channel layer 122 from gate electrode 112B. Gate dielectric layer 112A can be disposed between gate electrode 112B and S/D regions 110 to prevent electrical shorting in between.

Gate dielectric layer 112A can include silicon oxide and can be formed by chemical vapor deposition (CVD), atomic layer deposition (ALD), physical vapor deposition (PVD), e-beam evaporation, or other suitable processes. In some embodiments, gate dielectric layer 112A can include (i) a layer of silicon oxide, silicon nitride, and/or silicon oxynitride, (ii) a high-k dielectric material, such as hafnium oxide (HfO$_2$), titanium oxide (TiO$_2$), hafnium zirconium oxide (HfZrO), tantalum oxide (Ta$_2$O$_3$), hafnium silicate (HfSiO$_4$), zirconium oxide (ZrO$_2$), and zirconium silicate (ZrSiO$_2$), or (iii) a combination thereof. High-k dielectric layers can be formed by ALD and/or other suitable methods. In some embodiments, gate dielectric layer 112A can include a single layer or a stack of insulating material layers. Gate dielectric layer 112A can have a thickness ranging from about 1 nm to about 5 nm. Other materials and formation methods for gate dielectric layers 112A are within the spirit and scope of this disclosure.

Gate electrode 112B can be a gate terminal of FET 102. Gate electrode 112B can include metal stacks that can wrap about channel layer 122. In some embodiments, gate electrode 112B can include a gate barrier layer (not shown in FIGS. 1A and 1B), a gate work function layer (not shown in FIGS. 1A and 1B), and a gate metal fill layer (not shown in FIGS. 1A and 1B). The gate barrier layer can serve as a nucleation layer for subsequent formation of a gate work function layer. The gate barrier layer can include titanium (Ti), tantalum (Ta), titanium nitride (TiN), tantalum nitride (TaN), or other suitable diffusion barrier materials. The gate work function layer can include a single metal layer or a stack of metal layers. In some embodiments, the gate work function layer can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. Gate metal fill layer can include a single metal layer or a stack of metal layers. In some embodiments, the gate metal fill layer can include a suitable conductive material, such as Ti, silver (Ag), Al, titanium aluminum nitride (TiAlN), tantalum carbide (TaC), tantalum carbonitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and combinations thereof. Other materials for the gate barrier layer, the gate work function layer, and the gate metal fill layer are within the spirit and scope of this disclosure.

Gate spacer 114 can physically contact gate dielectric layers 112A. Gate spacer 114 can include a low-k material with a dielectric constant less than about 3.9. For example, gate spacer 114 can include insulating material, such as silicon oxide, silicon nitride, a low-k material, and a combination thereof. In some embodiments, gate spacer 114 can have a thickness ranging from about 2 nm to about 10 nm. Other materials and thicknesses for gate spacer 114 are within the spirit and scope of this disclosure.

Referring to FIGS. 1A and 1B, each FET 102 can further include an interlayer dielectric (ILD) layer 118 and a padding layer 126. ILD layer 118 can be disposed over fin structure 108 to provide an electrical insulation between fin structure 108 and interconnect structure 140. By way of example and not limitation, ILD layer 118 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can be silicon oxide or silicon nitride. In some embodiments, ILD layer 118 can have a thickness from about 50 nm to about 200 nm. Other materials, thicknesses, and formation methods for ILD layer 118 are within the spirit and scope of this disclosure.

Padding layer 126 can be disposed over gate structure 112 to provide an electrical insulation between gate structure 112 and interconnect structure 140. Padding layer 126 can be made of any suitable insulating material. By way of example and not limitation, Padding layer 126 can be made of silicon carbide, lanthanum oxide, aluminum oxide, aluminum oxynitride, zirconium oxide, hafnium oxide, silicon nitride, silicon, zinc oxide, zirconium nitride, zirconium aluminum oxide, titanium oxide, tantalum oxide, yttrium oxide, tantalum carbide nitride, zirconium silicide, silicon oxynitride carbide, silicon oxycarbide, silicon carbon nitride, hafnium silicide, silicon oxide, or combination thereof. In some embodiments, padding layer 126 can have a thickness from about 50 nm to about 200 nm. Other materials, thicknesses, and formation methods for padding layer 126 are within the spirit and scope of this disclosure.

FET 102 can further include a trench conductor layer 130 formed over S/D region 110 and/or gate structure 112. For example, as shown in FIG. 1B, trench conductor layer 130 can be formed through ILD layer 118 and padding layer 126 to contact the underlying S/D region 110. Therefore, trench conductor layer 130 can electrically bridge interconnect structure 140 and the underlying S/D region 110. In some embodiments, trench conductor layer 130 can be formed through padding layer 126 to contact with gate electrode 112B, where trench conductor layer 130 can electrically bridge interconnect structure 140 and the underlying gate electrode 112B. In some embodiments, trench conductor layer 130 can be substantially coplanar with ILD layer 118 and/or padding layer 126. Trench conductor layer 130 can be made of any suitable conductive materials, such as W, Al, Cu, Co, Ti, Ta, Ru, Mo, a silicide material, and a conductive nitride material. Trench conductor layer 130 can have an average horizontal dimension (e.g., width in the x-direction) and an average vertical dimension (e.g., height in the z-direction) based on a pitch size of FET 102. For example, trench conductor layer 130 can have an average horizontal dimension (e.g., width in the x-direction) in a range from about 15 nm to about 25 nm and can have an average vertical dimension (e.g., height in the z-direction) in a range from about 400 nm to about 600 nm. In some embodiments, trench conductor layer 130 can include slanted sidewalls, such that trench conductor layer 130's top surface's width can be greater than trench conductor layer 130's bottom surface's width. Based on the disclosure herein, other materials and dimensions for trench conductor layer 130 are within the spirit and scope of this disclosure.

Referring to FIG. 1B, each of interconnect structure 140 (e.g., interconnect structure 140$_1$ or 140$_2$) can be a connection network connecting between the underlying FETs 102 and neighboring active and passive elements (not shown in FIGS. 1A and 1B) integrated with or deposited on substrate 106. Although FIG. 1B shows two interconnect structures 140 (e.g., interconnect structure 140$_1$ or 140$_2$) stacking on one another, any number of interconnect structures 140 can be included in semiconductor device 100 to stack on one another. Interconnect structure 140 can include a layer of conductive material 146, a layer of insulating material 148 disposed over layer of conductive material 146, and a trench conductor layer 162 formed through layer of insulating material 148 and in contact with layer of conductive material 146.

Layer of conductive material 146 can be a wire routing for the interconnect structure 140. In some embodiments, layer of conductive material 146 can be disposed over trench conductor layer 130 to electrically connect to FET 102's S/D region 110 and/or FET 102's gate structure 112. In some embodiments, layer of conductive material 146 of an interconnect structure 140 (e.g., interconnect structure 140$_2$) can be disposed over trench conductor layer 162 of a vertically (e.g., in the z-direction) adjacent interconnect structure 140 (e.g., interconnect structure 140$_1$) to electrically connect to layer of conductive material 146 of the vertically adjacent interconnect structure 140 (e.g., interconnect structure 140$_1$). In some embodiments, layer of conductive material 146 can be a patterned layer. For example, interconnect structure 140 can further include a layer of insulating material 144 that can electrically isolate a layer of conductive material 146 from another layer of conductive material 146 (not shown in FIG. 1B) in interconnect structure 140. In some embodiments, layer of insulating material 144 can be laterally (e.g., in the x-y plane) adjacent to and substantially coplanar with layer of conductive material 146. Layer of conductive material 146 can include any suitable conductive material. By way of example and not limitation, layer of conductive material 146 can include Cu, Co, Ni, Al, In, W, Ru, rhodium (Rh), iridium (Ir), osmium (Os), carbon nanotubes, or a combination thereof. In some embodiments, layer of conductive material 146 can further include a barrier liner (not shown in FIG. 1B), such as TiN, TaN, and a conductive nitride material. Other conductive materials for layer of conductive material 146 are within the spirit and scope of this disclosure.

Layer of insulating material 148 can be sandwiched between layers of conductive material 146 of two vertically (e.g., in the z-direction) adjacent interconnect structures 140 (e.g., between interconnect structure 140$_1$ and interconnect structure 140$_2$). In some embodiments, layer of insulating material 148 can be further disposed over layer of insulating material 144 adjacent to layer of conductive material 146. Each of layer of insulating material 148 and layer of insulating material 144 can include any suitable insulating material. By way of example and not limitation, each of layer of insulating material 148 and layer of insulating material 144 can include silicon oxide, silicon nitride, silicon oxynitride, a low-k dielectric, or a high-k dielectric. In some embodiments, layer of insulating material 148 can include multiple dielectric layers (not shown in FIG. 1B) that have different etching selectivity from each other. Other insulating materials for layer of insulating material 148 and layer of insulating material 144 are within the spirit and scope of this disclosure.

Trench conductor layer 162 can electrically connect layers of conductive material 146 between layers of conductive material 146 of two vertically (e.g., in the z-direction) adjacent interconnect structures 140 (e.g., between interconnect structure 140$_1$ and interconnect structure 140$_2$). For example, trench conductor layer 162 can include a bottom surface 161 in contact with interconnect structure 140$_1$'s layer of conductive layer 146, and a top surface 165 in contact with interconnect structure 140$_2$'s layer of conductive layer 146. Trench conductor layer 162 can include any suitable conductive materials formed over layer of conductive material 146's top surface. In some embodiments, trench conductor layer 162 can include a metal conductor layer and a barrier layer disposed over the metallic layer (both not shown in FIG. 1B). By way of example and not limitation, the metal conductor layer can include W, Al, Cu, Co, Ti, Ta, Ru, Mo, or carbon nanotube. By way of example and not limitation, the barrier layer can include a metal (e.g., Ta or titanium tungsten (TiW)), a metal oxide (e.g., alumina, manganese oxide, chromium oxide, niobium oxide, or titanium oxide), or a metal nitride (e.g. TaN or TiN). In some embodiments, the barrier layer can have a thickness ranging from about 5 Å to about 30 Å. Trench conductor layer 162 can have a horizontal dimension (e.g., width in the x-direction) and a vertical dimension (e.g., height in the z-direction) based on a pitch size of FET 102. For example, trench conductor layer 162 can have a vertical (e.g., in the z-direction) height ranging from about 5 nm to about 1000 nm. In some embodiments, trench conductor layer 162's bottom surface 161 can have a horizontal (e.g., in the x-direction) width $W_{161}$ ranging from about 1 nm to about 80 nm. In some embodiments, trench conductor layer 162's top surface 165 can have a horizontal (e.g., in the x-direction) width $W_{165}$ ranging from about 1 nm to about 80 nm. In some embodiments, trench conductor layer 162 can include slanted sidewalls, such that trench conductor layer 162's top surface's width can be greater than trench conductor layer 162's bottom surface's width. Based on the disclosure herein, other materials, widths, and heights for trench conductor layer 162 are within the spirit and scope of this disclosure.

In some embodiments, interconnect structure 140 can further include a conductive capping layer 142 to inhibit electromigration associated with layer of conductive material 146. For example, conductive capping layer 142 can be selectively formed over layer of conductive material 146's top surface to block the outflow or the out-diffusion of metallic atoms from layer of conductive material 146. Conductive capping layer 142 can be made of any suitable barrier material that has less atomic mobility. In some embodiments, conductive capping layer 142 can be made of any suitable conductive material that has less atomic mobility. By way of example and not limitation, conductive capping layer 142 can include Co, W, Ta, TiN, TaN, or Ru. As shown in FIG. 1B, conductive capping layer 142 can include a top surface 145 and a sidewall 143, both in contact with layer of insulating material 148. Conductive capping layer 142 can further include a bottom surface 141 in contact with layer of conductive material 146. In some embodiments, conductive capping layer 142 can further include a lower shoulder structure 154 resulting from a lateral (e.g., in the x-direction) extension of conductive capping layer 142 during the growth of conductive capping layer 142. Lower shoulder structure 154 can connect bottom surface 141 and sidewall 143 by tapering from sidewall 143 to bottom surface 141. For example, lower shoulder structure 154 can have a warped surface, a curved surface, or a rounded surface that tapers from sidewall 143 towards bottom surface 141. In some embodiments, conductive capping layer 142 can also include an upper shoulder structure 152 that can connect top surface 145 and sidewall 143 by tapering from sidewall 143 to top surface 145. For example, upper shoulder structure 152 can have a warped surface, a curved surface, or a rounded surface that tapers from sidewall 143 toward top surface 145. In some embodiments, conductive capping layer 142 can horizontally (e.g., in the x-direction) extend from layer of conductive material 146 towards layer of insulating material 144. Conductive capping layer 142's bottom surface 141 can cover both layer of conductive material 146's top surface and edge portions of layer of insulating material 144's top surface. In some embodiments, conductive capping layer 142 can have a horizontal (e.g., in the x-direction) extension $EXT_{142}$ over layer of insulating material 144 ranging from about 0.1 nm to about 10 nm. Other dimensions of $EXT_{142}$ are within the spirit and scope of this disclosure.

Further, as shown in FIG. 1B, trench conductor layer 162 can be formed through layer of insulating material 148 and metallic capping layer 142 to physically contact the underlying layer of conductive material 146. For example, trench conductor layer 162 can further include an upper sidewall 163A in contact with layer of insulating material 148, and a lower sidewall 163B in contact with metallic capping layer 142. Trench conductor layer 162's bottom surface 161 between two opposite (e.g., in the x-direction) lower sidewalls 163B can physically contact layer of conductive material 146. Since trench conductor layer 162 can be formed through metallic capping layer 142 to directly contact the underlying layer of conductive material 146 without any intermediate layer in between, the contact resistance between layer of conductive material 146 and trench conductor layer 162 can be reduced. Accordingly, interconnect structure 140 can provide a low resistance routing network for FETs 102 with alleviated electromigration failure.

In some embodiments, trench conductor layer 162 can physically contact layer of conductive material 146 with a contact area substantially identical to bottom surface 161's area. In some embodiments, trench conductor layer 162 can physically contact layer of conductive material 146 with a contact area substantially identical to a horizontally (e.g., parallel to the x-y plane) cross-sectional area $A_{163B}$ between two opposite lower sidewalls 163B. In some embodiments, trench conductor layer 162 can physically contact layer of conductive material 146 with a contact area from about 50% to about 100% of cross-sectional area $A_{163B}$, from about 60% to about 100% of cross-sectional area $A_{163B}$, from about 70% to about 100% of cross-sectional area $A_{163B}$, from about 80% to about 100% of cross-sectional area $A_{163B}$, or from about 90% to about 100% of cross-sectional area $A_{163B}$. In some embodiments, trench conductor layer 162 can physically contact layer of conductive material 146 with a contact area substantially identical to a horizontally (e.g., parallel to the x-y plane) cross-sectional area $A_{163A}$ between two opposite upper sidewalls 163A. In some embodiments, trench conductor layer 162 can physically contact layer of conductive material 146 with a contact area from about 50% to about 100% of cross-sectional area $A_{163A}$, from about 60% to about 100% of cross-sectional area $A_{163A}$, from about 70% to about 100% of cross-sectional area $A_{163A}$, from about 80% to about 100% of cross-sectional area $A_{163A}$, or from about 90% to about 100% of cross-sectional area $A_{163A}$. In some embodiments, upper sidewall 163A can be a slanted surface, such that cross-sectional area $A_{163A}$ can range about from about 30% to about 100% to top surface 165's area. In some embodiments, lower sidewall 163B can be a slanted surface, such that cross-sectional area $A_{163B}$ can range about from about 10% to about 100% to top surface 165's area. In some embodiments, upper sidewall 163A and lower sidewall 163B can be a continuous side surface. In some embodiments, upper sidewall 163A and lower sidewall 163B can be laterally (e.g., in the x-direction) displaced from each other.

In some embodiments, an intermediate layer (not shown in FIG. 1B) can be formed between trench conductor layer 162 and layer of conductor material 146 when forming trench conductor layer 162 through metallic capping layer 142. The intermediate layer (not shown in FIG. 1B) can be formed between a first portion of bottom surface 161 and layer of conductive material 146, while a second portion of bottom surface 161 can physically contact layer of conductive material 146. By way of example and not limitation, the intermediate layer can be a residue layer (e.g., intermixing layer 742 as latter discussed in FIGS. 7A-7B) associated with metallic capping layer 142. For example, the intermediate layer can be a metallic layer that can include halogen compounds, such as a mixture compound of fluorine and metallic capping layer 142 or a mixture compound of chlorine and metallic capping layer 142. In some embodiments, the intermediate layer can be a layer of dielectric material, a layer of oxide material, or a layer of insulating material. A coverage of the intermediate layer over bottom surface 161 can be determined by an etching efficiency of the etching process when forming via 801 (not shown in FIG. 1B; shown in FIG. 8) through conductive capping layer 142. For bottom surface 161's width $W_{161}$ that can range from about 1 nm to about 80 nm, at least 50% of the intermediate layer can be removed by the etching process when forming via 801. Accordingly, trench conductor layer 162 can contact layer of conductive material 146 with a contact area greater than about 50%. In some embodiments, trench conductor layer 162 can partially contact layer of conductive material 146 with a contact area from about 50% to about 100% of bottom surface 161's area, from about 60% to about 100% of bottom surface 161's area, from about 70% to about 100% of bottom surface 161's area, from about 80% to about 100% of bottom surface 161's area, or from about 90% to about 100% of bottom surface 161's area.

Figure 2:
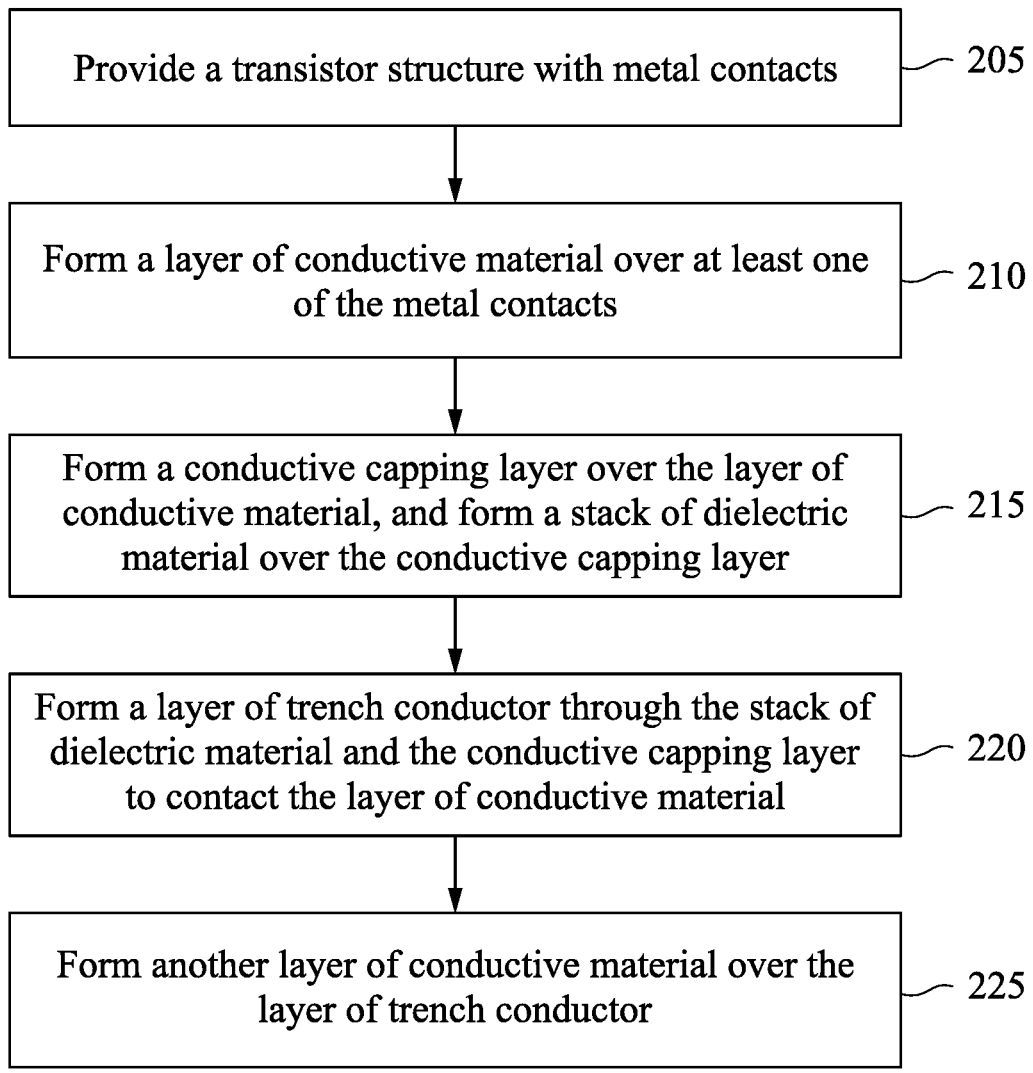
FIG. 2 is a flow diagram of a method for fabricating a semiconductor device, according to some embodiments.
Figure 3B:
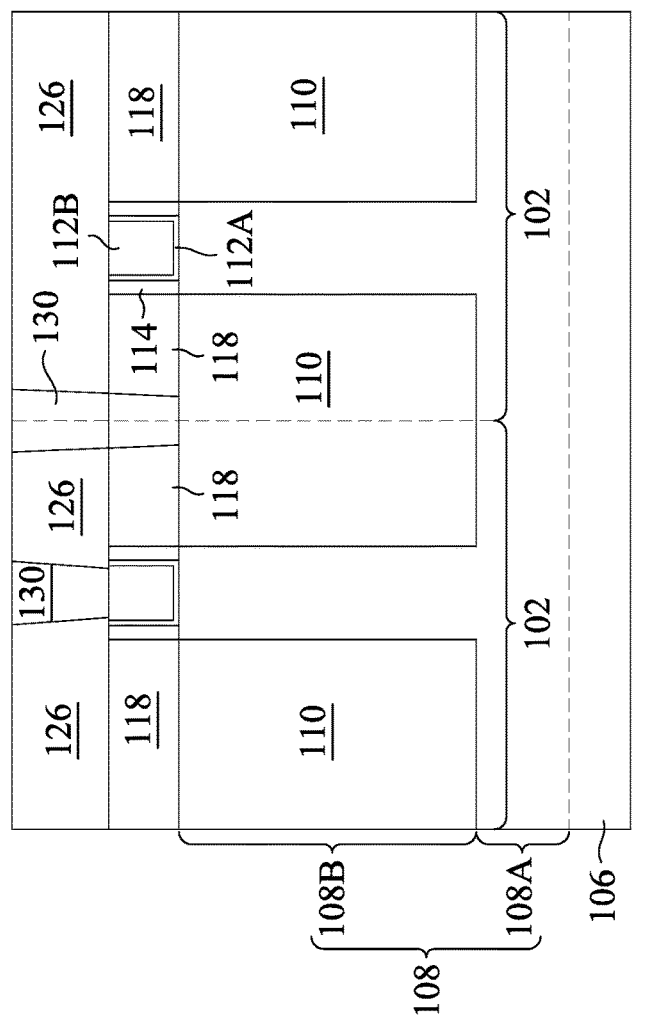
FIGS. 3B, 4-6, 7A-7C, and 8-10 illustrate cross-sectional views of a semiconductor device at various stages of its fabrication process, according to some embodiments.
Figure 3A:
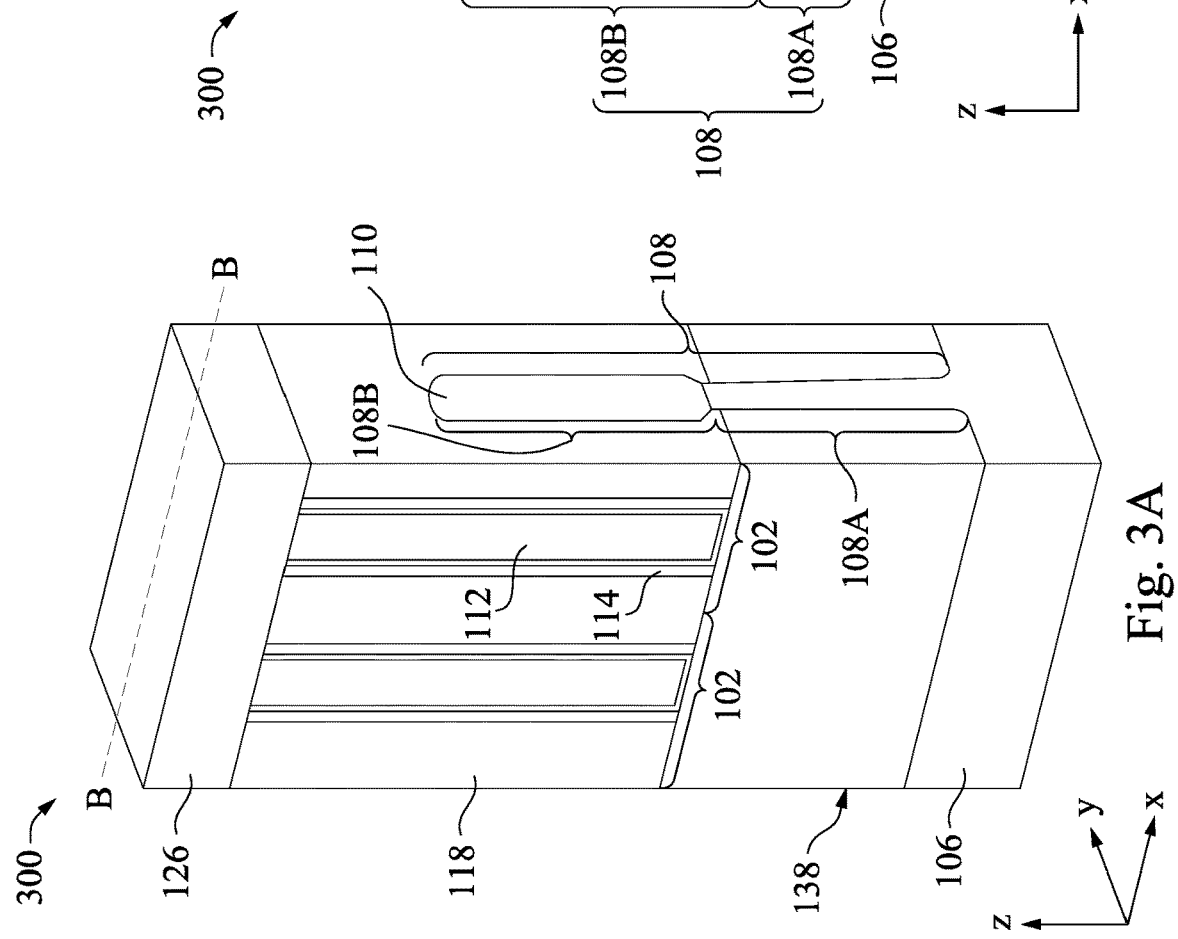
FIG. 3A illustrates an isometric view of a semiconductor device at a stage of its fabrication process, according to some embodiments.

FIG. 2 is a flow diagram of an example method 200 for fabricating semiconductor device 100, according to some embodiments. For illustrative purposes, the operations illustrated in FIG. 2 will be described with reference to FIGS. 3A-3B, 4-6, 7A-7C, and 8-10. FIG. 3A is an isometric view of semiconductor device 100 at various stages of its fabrication, according to some embodiments. FIGS. 3B, 4-6, 7A-7C, and 8-10 are cross-sectional views along line B-B of FIG. 3A at various stages of its fabrication to form semiconductor device 100, according to some embodiments (e.g., semiconductor devices 300-900 of FIGS. 3B, 4-6, 7A-7C, 8, and 9 can represent stages of fabrication to form semiconductor device 100.) Operations can be performed in a different order or not performed depending on specific applications. Method 200 may not produce a complete semiconductor device 100. Accordingly, it is understood that additional processes can be provided before, during, and after method 200, and that some other processes may only be briefly described herein. Further, the discussion of elements in FIGS. 1A, 1B, 3A-3B, 4-6, 7A-7C, and 8-10 with the same annotations applies to each other, unless mentioned otherwise.

Referring to FIG. 2, in operation 205, a transistor structure with metal contacts is provided. For example, FIG. 3B shows a semiconductor device 300 with one or more FETs 102 having trench conductor layers 130. Referring to FIGS. 3A and 3B, semiconductor device 300 can include fin structure 108 traversed by gate structures 112 and encapsulated by ILD layer 118 and padding layer 126. By way of example and not limitation, the formation of semiconductor device 300 can include forming fin structure 108 on substrate 106, forming STI region 138 adjacent to fin structure 108, forming gate structure 112 traversing through fin structure 108, forming S/D regions 110, forming ILD layer 118 over a portion of fin structure 108 not covered by gate structure 112, and forming padding layer 126 over gate structure 112 and ILD layer 118. The formation of semiconductor device 300 can further include forming trench conductor layer 130 through padding layer 126 and ILD layer 118 to contact S/D regions 110 and/or gate structure 112. Based on the disclosure herein, other formation methods for semiconductor device 300 are within the spirit and scope of this disclosure.

Figure 4:
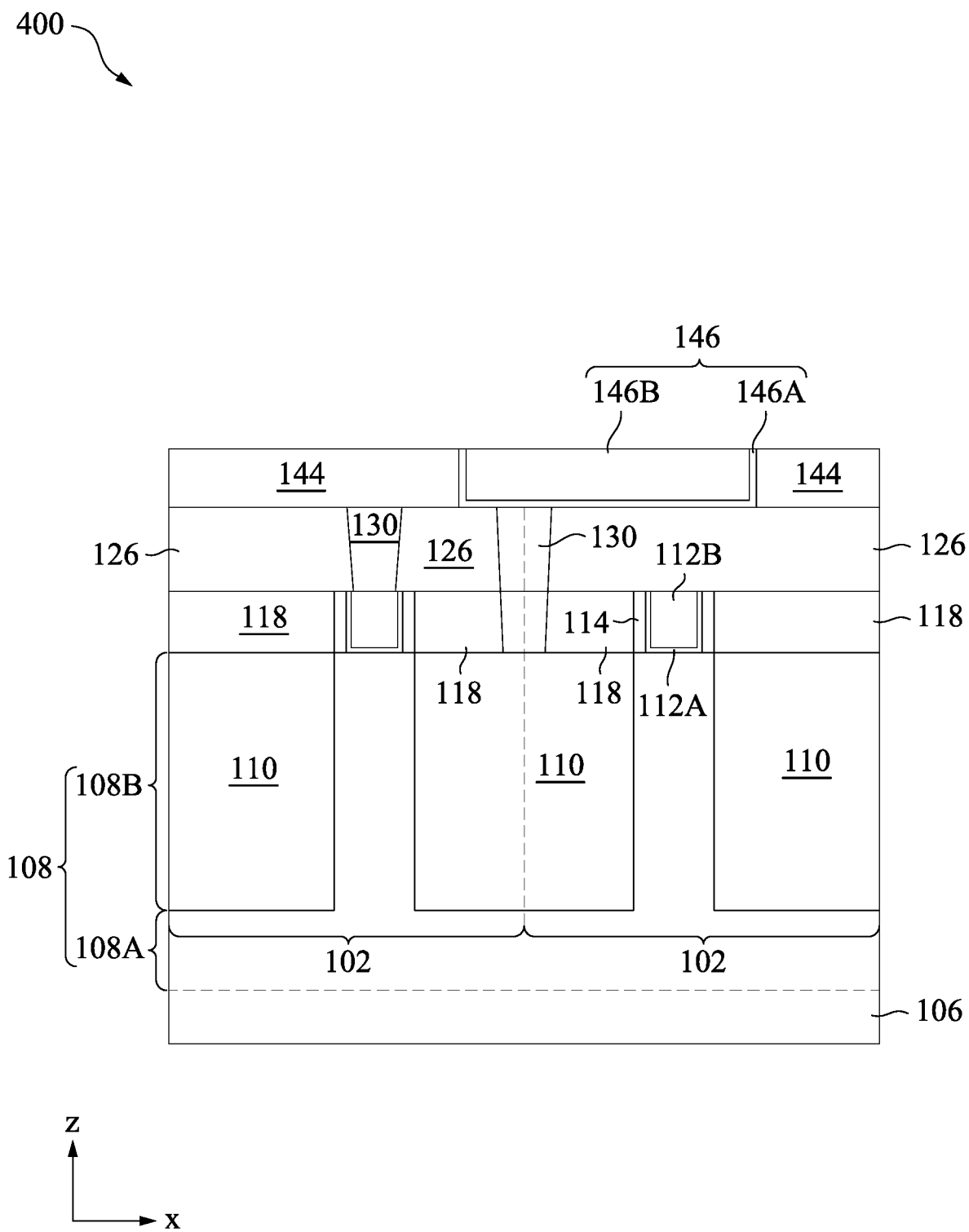

Referring to FIG. 2, in operation 210, a layer of conductive material is formed over at least one of the metal contacts. For example, as shown in FIG. 4, layer of conductive material 146 can be formed over the underlying FET 102's trench conductor layer 130. In some embodiments, layer of conductive material 146 can include a wire conductor layer 146B and a barrier liner layer 146A surrounding wire conductor layer 146B's bottom and sides. By way of example and not limitation, a process for forming layer of conductive material 146 can include (i) forming a patterned layer of insulating material 144 over semiconductor device 300 of FIGS. 3A and 3B to expose one or more trench conductor layers 130 using a deposition process, a lithography process, and an etching process, (ii) blanket depositing a barrier liner material and a conductive material over the patterned layer of insulating material 144 using a deposition process, and (iii) polishing the deposited barrier liner material and the conductive material using a chemical mechanical polishing (CMP) process to form layer of conductive material 146 (e.g., wire conductor layer 146B and barrier liner layer 146A) substantially coplanar with layer of insulating material 144. In some embodiments, layer of insulating material 144 can expose a group of trench conductor layers 130 while covering another group of trench conductor layers 130. In some embodiments, the deposition process for layer of insulating material 144 can include depositing a dielectric material using chemical vapor deposition (CVD), plasma enhanced chemical vapor deposition (PECVD), a spin-on process, physical vapor deposition (PVD), or atomic layer deposition (ALD). By way of example and not limitation, the dielectric material for layer of insulating material 144 can include any suitable insulating material, such as silicon oxide, silicon nitride, silicon oxynitride, silicate glass, aluminum oxide, hafnium oxide, zirconium oxide, a low-k dielectric, and a high-k dielectric. In some embodiments, the deposition process for barrier liner material and/or the conductive material can include a CVD process, a PVD process, an ALD process, a plating process, or an electroless deposition (ELD) process. By way of example and not limitation, the barrier liner material for layer of conductive material 146 can include includes a metallic material (e.g., Ta or TiW), a metal oxide (e.g., alumina, manganese oxide, chromium oxide, niobium oxide, titanium oxide, or combinations thereof), a metal nitride (e.g. TaN or TiN), a metal compound (e.g., alumina, manganese oxide, chromium oxide, niobium oxide, titanium oxide, and/or combinations thereof), a carbon-containing material, or combinations thereof. By way of example and not limitation, the conductive material for layer of conductive material 146 can include Cu, Co, Ni, Ru, Rh, Ir, Os, Al, In, Ag, Au, W, or carbon nanotubes.

Referring to FIG. 2, in operation 215, a conductive capping layer is formed over the layer of conductive material, and a stack of dielectric material is formed over the conductive capping layer. For example, as shown in FIG. 6, conductive capping layer 142 can be formed over layer of conductive material 146, and layer of insulating material 148 can be formed over conductive capping layer 142, as described with reference to FIGS. 5 and 6.

Figure 5:
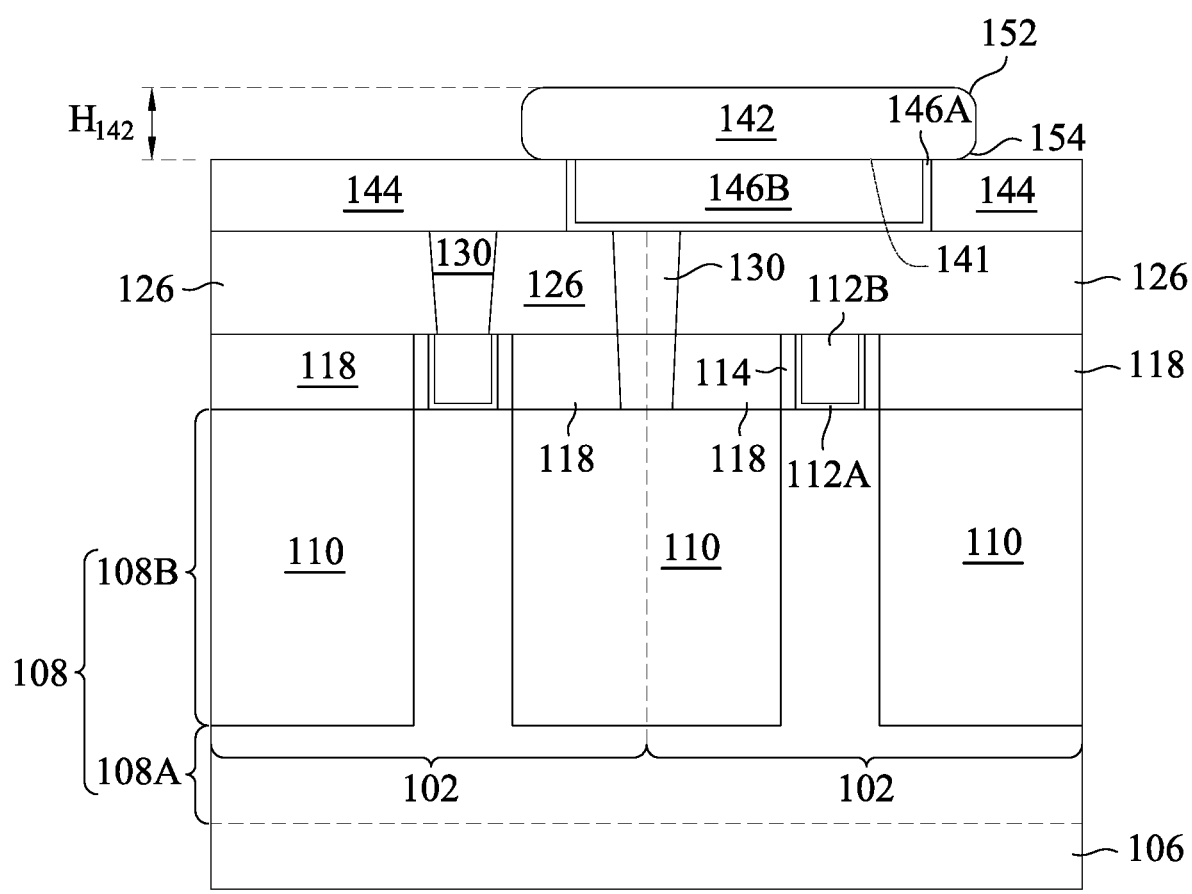

Referring to FIG. 5, a process for forming conductive capping layer 142 can include selectively growing one or more conductive materials over layer of conductive material 146 while exposing adjacent layer of insulating material 144 using a selective deposition process. For example, the one or more conductive materials can be selectively grown over barrier liner layer 146A and conductor layer 146B. In some embodiments, the one or more conductive materials can be laterally extended and formed over layer of insulating material 144's edge portion adjacent to layer of conductive material 146 during the growth of the one or more conductive materials. Accordingly, the resulting conducive capping layer 142 can include upper shoulder structure 152 and lower shoulder structure 154. By way of example and not limitation, the one or more conductive materials for conductive capping layer 142 can include Co, W, Ta, TiN, or TaN. In some embodiments, the selective deposition process for forming conductive capping layer 142 can include an ALD process, a CVD process, a plating process, or an ELD process. For example, a CVD process can selectively deposit Co over layer of conductive material 146 by using an appropriate precursor, such as Ru, that can selectively nucleate over layer of conductive material 146. The resulting conductive capping layer 142 can fully encapsulate the underlying layer of conductive material 146 to inhibit the electromigration associated the underlying layer of conductive material 146. In some embodiments, the resulting conductive capping layer 142's thickness $H_{142}$ can range from about from about 2 nm to about 5 nm. Other thicknesses of $H_{142}$ are within the spirit and scope of this disclosure.

In some embodiments, a process of selectively forming conductive capping layer 142 over layer of conductive material 146 can include (i) selectively forming a layer of inhibitor material (not shown in FIG. 5) over layer of insulating material 144 of semiconductor device 400 of FIG. 4 using a self-assembly process and (ii) blanket depositing the one or more conductive material (e.g., Co, W, Ta, TiN, or TaN) using a deposition process, where the deposition process can be delayed or inhibited on the surface of the layer of inhibiting material. Accordingly, the one or more conductive material can be patterned to selectively form conductive capping layer 142 over layer of conductive material 146.

Figure 6:
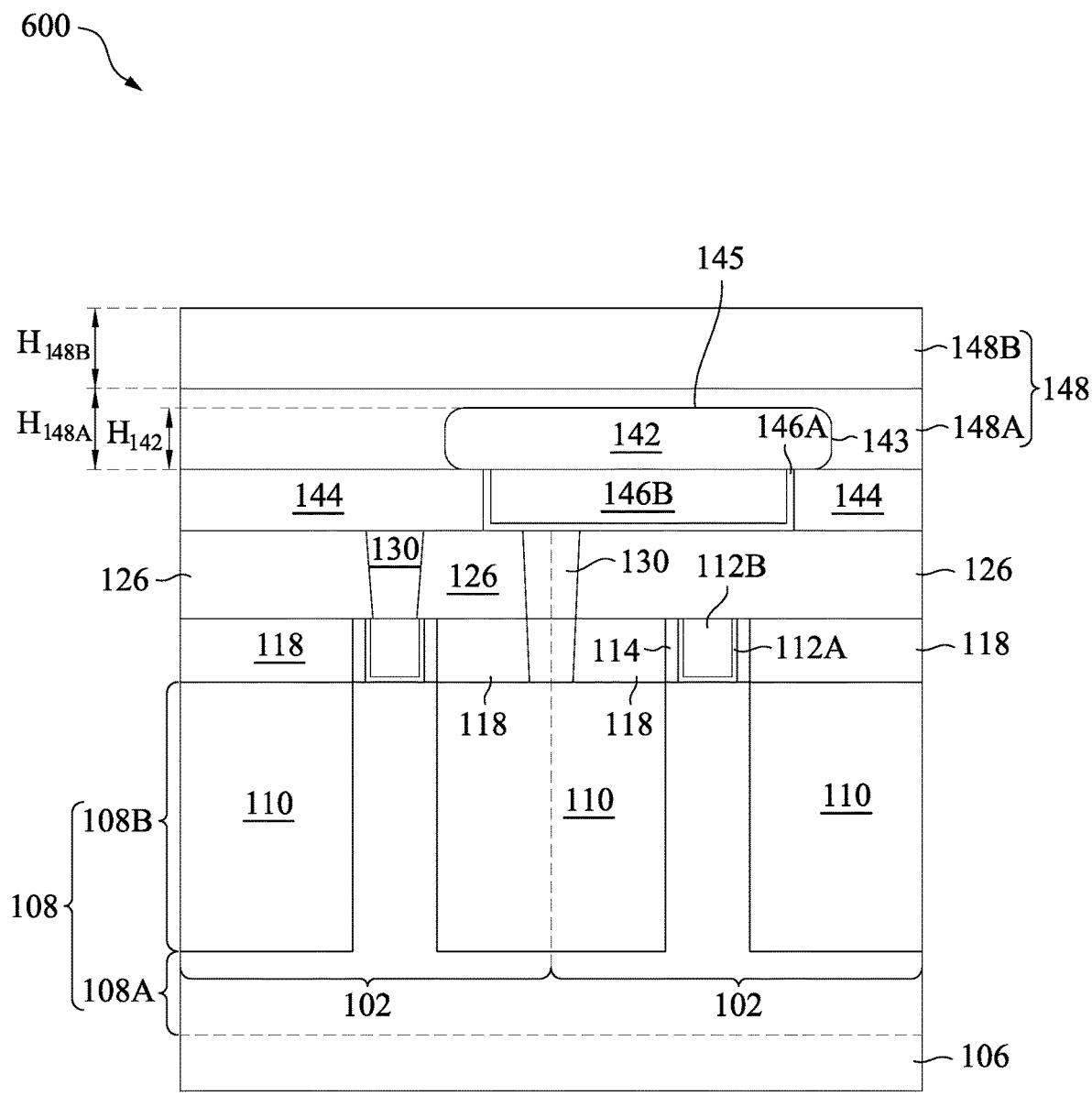

Referring to FIG. 6, a process for forming layer of insulating material 148 can include sequentially blanket depositing one or more dielectric layers over semiconductor device 500 of FIG. 5 via a deposition process. For example, as shown in FIG. 6, the deposition process can deposit etch stop layer (ESL) 148A over layer of insulating material 144 and conductive capping layer 142 and deposit a layer of dielectric material 148B over ESL 148A. By way of example and not limitation, the deposition process for forming layer of insulating material 148 can include a CVD process, an ALD process, a PVD process, or a high-density-plasma (HDP) CVD process. Although FIG. 6 illustrates depositing two dielectric layers (e.g., ESL 148A and layer of dielectric material 148B) to form layer of insulating material 148, any number of dielectric layers can be sequentially deposited to form layer of insulating material 148. In some embodiments, the one or more dielectric layers (e.g., ESL 148A and layer of dielectric material 148B) can have different etching selectivity from each other. Accordingly, each of the one or more dielectric layers can have different thickness based on the etching selectivity between each other. As such, a thickness ratio between layer of dielectric material 148B to ESL 148A (e.g., thickness $H_{148B}$:thickness $H_{148A}$) can range from about 10 to about 150 based on the etching selectivity in between. In some embodiments, a dielectric layer (e.g., ESL 148A) of the one or more dielectric layers that physically contacts conductive capping layer 142 can encapsulate conductive capping layer 142's top surface 145 and sidewall 143. For example, ESL 148A's thickness $H_{148A}$ can be greater than conductive capping layer 142's thickness $H_{142}$ to encapsulate top surface 145 and side surfaces 143. Each of the one or more dielectric layers (e.g., ESL 148A and layer of dielectric material 148B) can include suitable insulating materials. In some embodiments, a dielectric layer (e.g., ESL 148A) of the one or more dielectric layers that physically contacts conductive capping layer 142 can include a catalyst material that can assist an etching process to form intermixing layer 742 (e.g., shown in FIGS. 7A-7C) in conductive capping layer 142 at operation 220. In some embodiments, each of the one or more dielectric layers for forming layer of insulating material 148 can include the catalyst material. In some embodiments, the catalyst material can include a nitride material, such as aluminum nitride, silicon nitride, nitrogen-doped silicon carbide, silicon carbide, or oxygen-doped silicon carbide. In some embodiments, each of the one or more dielectric layers (e.g., ESL 148A and layer of dielectric material 148B) can include silicon oxide, silicon nitride, silicon oxynitride, silicon carbide, silicon carbon nitride, silicon oxycarbide, silicon oxycarbonitride, aluminum oxide, aluminum oxynitride, zirconium oxide, zirconium aluminum oxide, hafnium oxide, a low-k dielectric material, or a high-k dielectric material.

Referring to FIG. 2, in operation 220, a layer of trench conductor is formed through the stack of dielectric material and the conductive capping layer to contact the layer of conductive material. For example, as shown in FIG. 9, trench conductor layer 162 can be formed through layer of insulating material 148 and conductive capping layer 142 to physically contact layer of conductive material 146, as described with reference to FIGS. 7A-7C, 8, and 9. A process for forming layer of trench conductor 162 can include (i) forming a patterned hard mask layer 772 (shown in FIG. 7A) over semiconductor device 600 of FIG. 6, (ii) forming a via 701 in layer of insulating material 148 (shown in FIG. 7A), (iii) forming via 801 with horizontal (e.g., in the x-direction) width $W_{161}$ through conductive capping layer 142 to expose layer of conductive material 146 (shown in FIG. 8), and (iv) filling one or more conductive materials in via 801 to form trench conductor layer 162 that physically contact layer of conductive material 146.

Figure 7A:
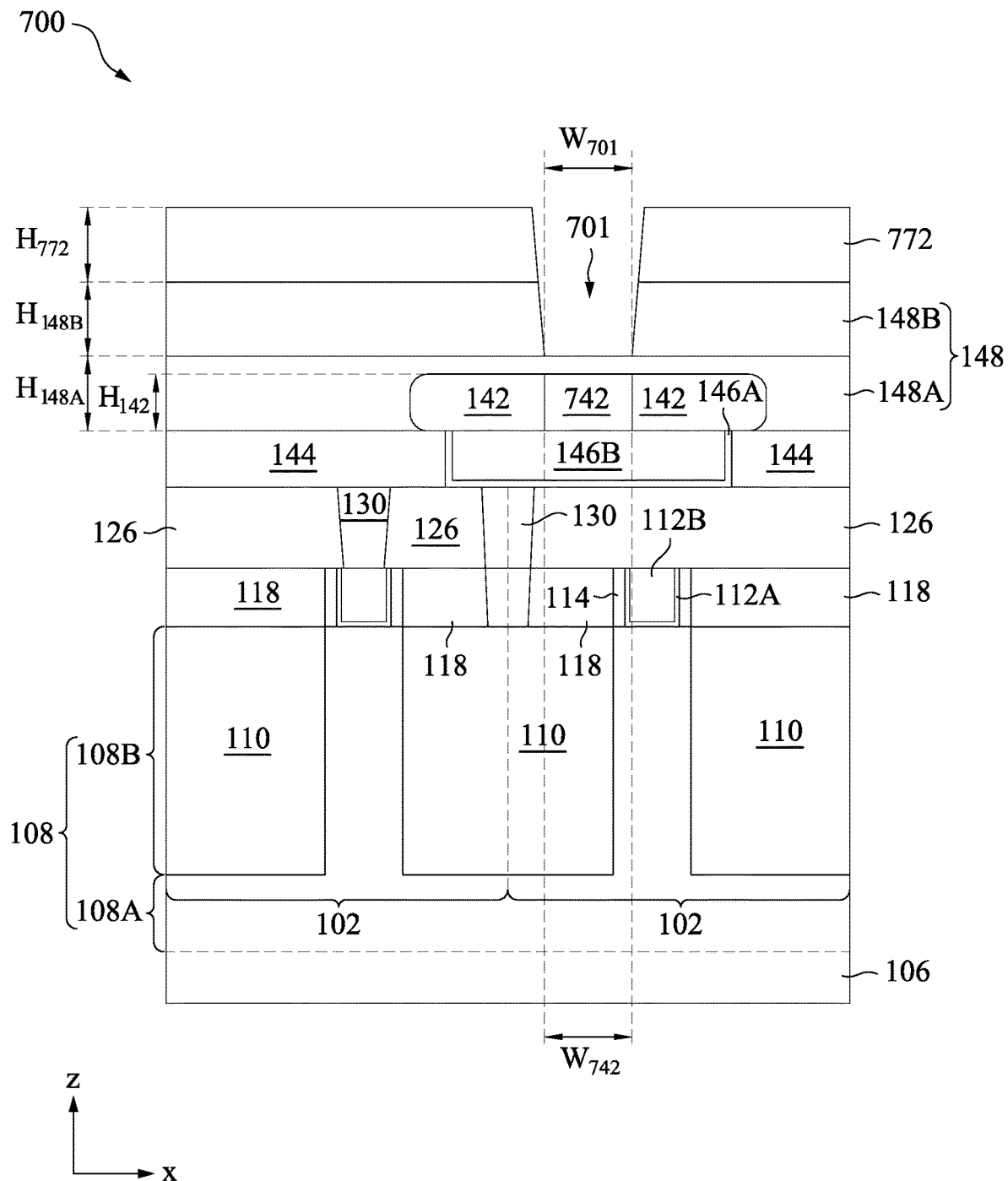

Referring to FIG. 7A, a process for forming hard mask layer 772 can include (i) blanket forming a dielectric material over layer of insulating material 148 and (ii) etching the dielectric material through a photoresist layer (not shown in FIG. 7A) patterned by a lithography process. By way of example and not limitation, the dielectric material for hard mask layer 772 can include silicon oxide that can be deposited using any suitable deposition method, such as a CVD process, a PECVD process, a PVD process, and an ALD process. In some embodiments, the dielectric material for hard mask layer 772 can be a polymer layer that can be formed using a spin-coating method. In some embodiments, the resulting hard mask layer 772 can have a thickness $H_{772}$ ranging from about 10 nm to about 50 nm. Based on the disclosure herein, other material and thickness for hard mask layer 772 are within the scope and spirit of this disclosure.

A process for forming via 701 can include etching layer of insulating material 148 through hard mask layer 772 using an etching process. In some embodiments, the etching process can remove an upper portion of layer of insulating material 148 while preserving a lower portion of layer of insulating material 148. For example, as shown in FIG. 7A, due to the etching selectivity between layer of dielectric material 148B and ESL 148A, the etching process can remove layer of dielectric material 148B to form via 701 that can land on ESL 148A. In some embodiments, the etching process can remove layer of insulating material 144 to form via 701 with slanted sidewalls. The etching process for forming via 701 can include a wet etching process, a dry etching process, or a combination thereof. In some embodiments, the wet etching process can include using a diluted hydrofluoric acid (DHF) treatment, an ammonium peroxide mixture (APM), a sulfuric peroxide mixture (SPM), hot deionized water (DI water), tetramethylammonium hydroxide (TMAH), or a combination thereof. In some embodiments, the dry etching process can include using a plasma dry etch associated with a gas mixture having octafluorocyclobutane ($C_4F_8$), fluoroform ($CHF_3$), carbon tetrafluoride ($CF_4$), difluoromethane ($CH_2F_2$), argon (Ar), nitrogen ($N_2$), oxygen ($O_2$), helium (He), chlorine ($Cl_2$), hydrogen bromide (HBr), or a combination thereof. In some embodiments, the resulting via 701 can have a horizontal (e.g., in the x-direction) width $W_{701}$ ranging from about 1 nm to about 80 nm. Other via 701's widths $W_{701}$ are within the scope and spirit of this disclosure.

Further, as shown in FIG. 7A, the process for forming via 701 can also result in the formation of an intermixing layer 742 in conductive capping layer 142. Intermixing layer 742 can result from an reaction between portions of conductive capping layer 142 under via 701 and the etching process for forming via 701. For example, the etching process for forming via 701 can include a dry etch using a fluorine-contained plasma that removes layer of dielectric material 148B. Based on the power and the biased voltage associated with fluorine-contained plasma, the straggle (e.g., standard deviation of plasma's drift and/or diffusion) of the fluorine-contained plasma can be greater than portions of ESL 148A above conductive capping layer 142 (e.g., straggle≥$H_{148A}$–$H_{142}$). Accordingly, portions of the fluorine-contained plasma can penetrate through ESL 148A to react with conductive capping layer 142 to form intermixing layer 742 that includes compounds of fluorine and the material of conductive capping layer 142. In some embodiments, conductive capping layer 142 can include Co, where the associated intermixing layer 742 can include a compound of Co and fluorine (e.g., $CoF_x$). Based on the plasma species associated with the dry etch process, in some embodiments, intermixing layer 742 can include the compound of the material of conductive capping layer 142, chlorine, bromine, carbon, oxygen, sulfur, phosphorus, or nitrogen. In some embodiments, the plasma straggle of the dry etch process can change crystallinity of the portions of conductive capping layer 142 under via 701. Accordingly, intermixing layer 742 can be an amorphized counterpart of conductive capping layer 142. In some embodiments, the plasma straggle of the dry etch process can sputter a material from layer of insulating material 148, where such sputtered material can be a catalyst to convert the underlying conductive capping layer 142 to form intermixing layer 742. For example, ESL 148A can be made of aluminum nitride that can be sputtered by the plasma straggle as a catalyst to form intermixing layer 742. In some embodiments, a bias voltage associated with the dry etch process can range from about 10 volts to about 1000 volts to provide the straggle that can penetrate through ESL 148A to form intermixing layer 742. In some embodiments, a radio-frequency (RF) power associated with the dry etch process can range from about 10 Watts to about 1000 Watts to provide the straggle that can penetrate through ESL 148A to form intermixing layer 742. In some embodiments, due to the lateral (e.g., along the x-y plane) of the straggle of the dry etch process, intermixing layer 742 can have a horizontal (e.g., in the x-direction) width $W_{742}$ greater than via 701's bottom width $W_{701}$. In some embodiments, intermixing layer 742's width $W_{742}$ can be substantially identical to via 701's bottom width $W_{701}$.

Figure 7B:
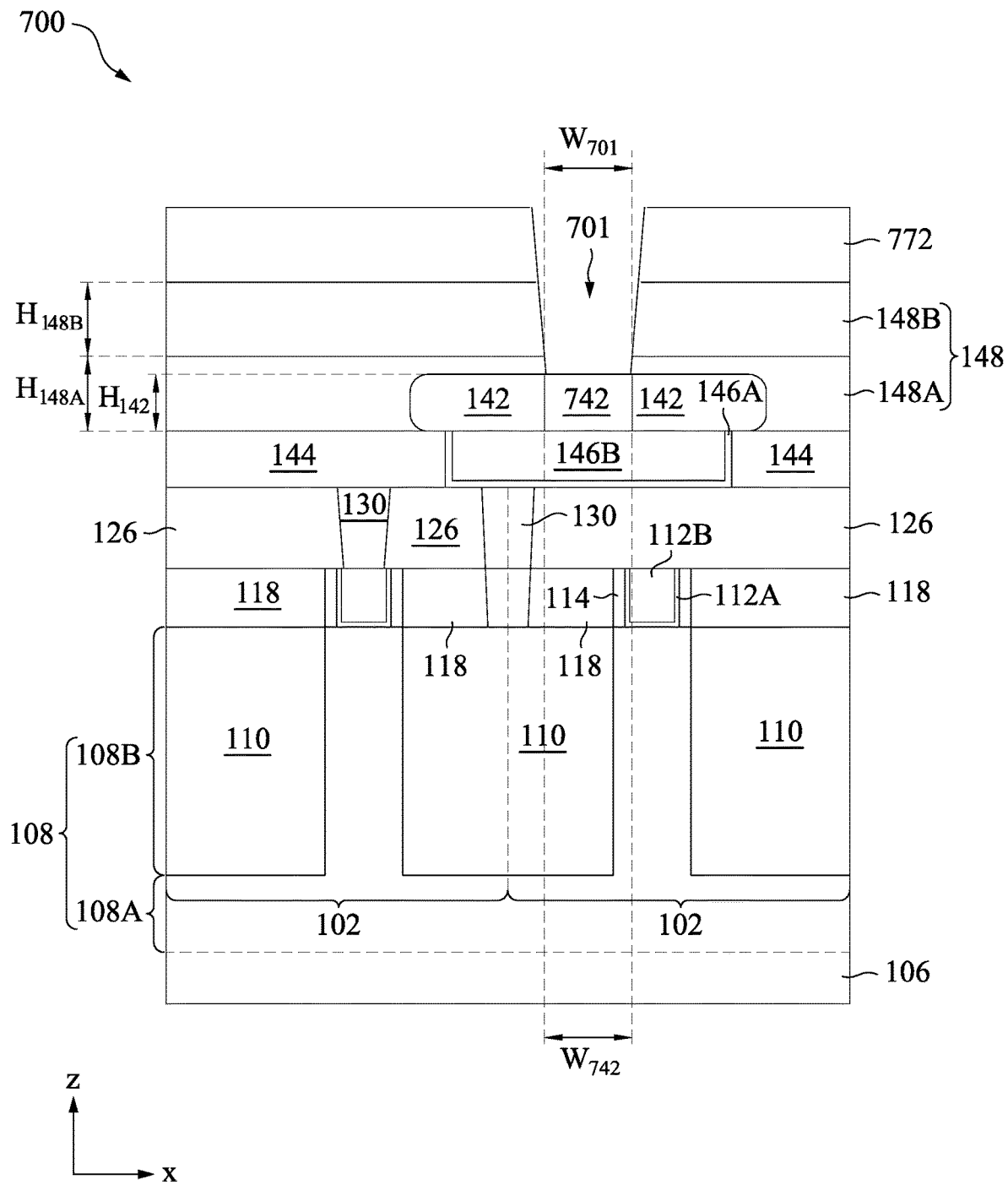

In some embodiments, the etching process for forming via 701 can etch through layer of insulating material 148. Referring to FIG. 7B, the etching process can remove each of ESL 148A and layer of dielectric material 148B. In some embodiments, the etching process can include a dry etch process that can further result in intermixing layer 742 under via 701 as previously discussed. Accordingly, the resulting via 701 can be formed through layer of insulating material 148 to expose intermixing layer 742.

Figure 7C:
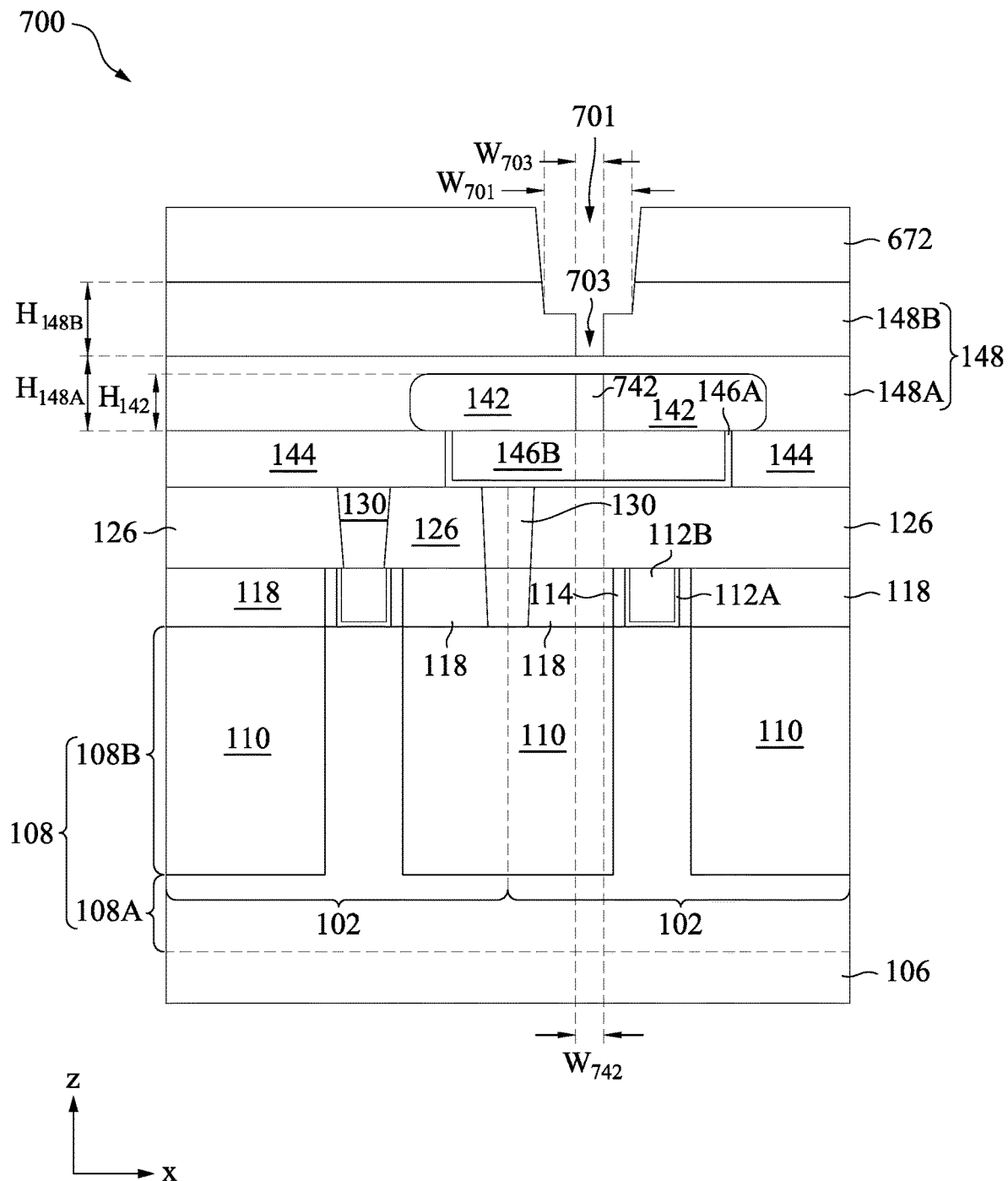

In some embodiments, referring to FIG. 7C, after forming via 701 in layer of insulating material 148, a via 703 can be further formed in via 701 with narrower bottom width $W_{703}$ (e.g., width $W_{703}$<width $W_{701}$). By way of example and not limitation, a process for forming via 703 can include (i) forming a photoresist layer (not shown in FIG. 7C) in via 701 using a lithography process, and (ii) remove layer of insulating material 148 through the photoresist using an etching process. In some embodiments, the etching process can include a dry etch process that can further form intermixing layer 742 under via 703 as previously discussed.

Figure 8:
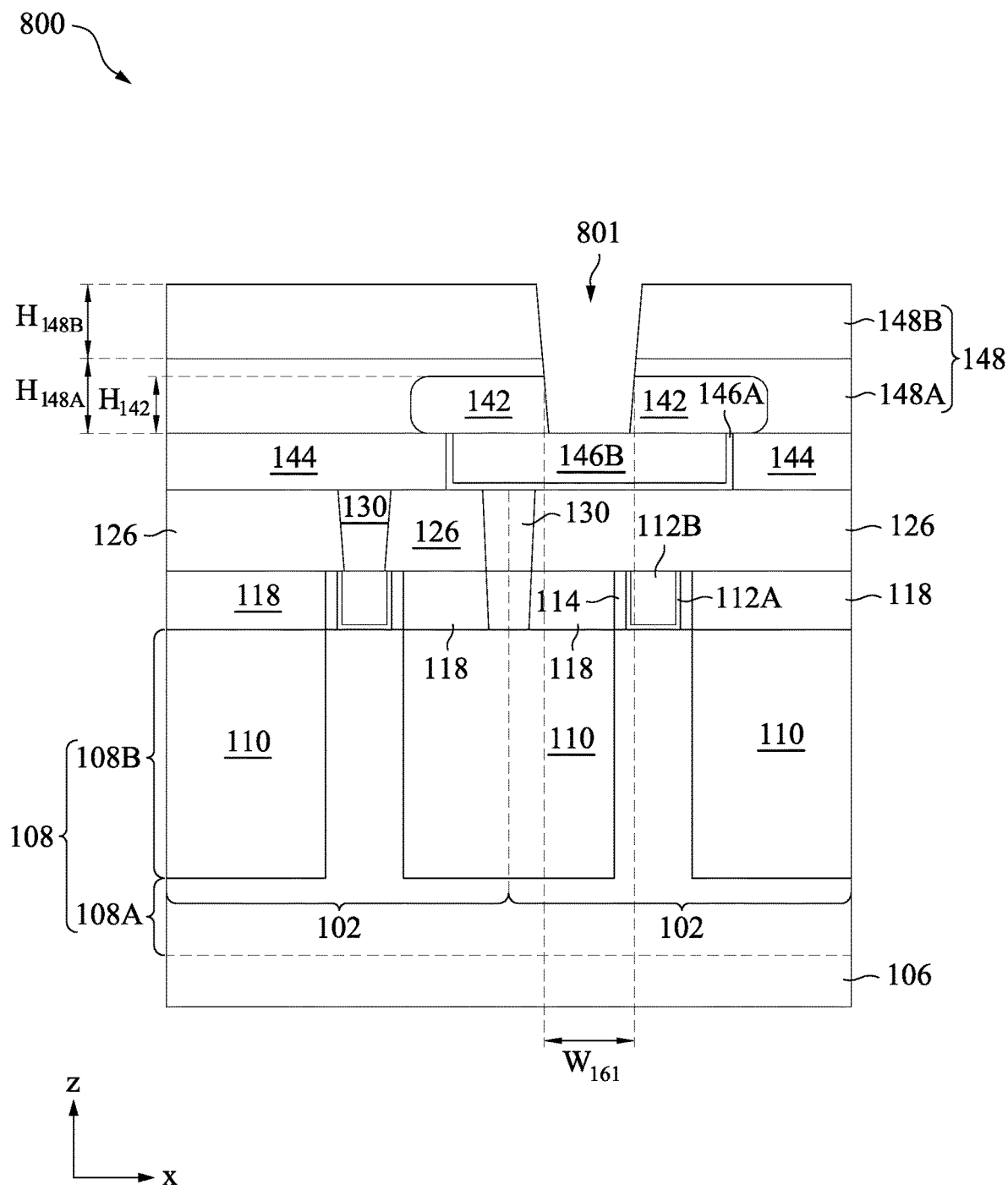
Figure 9:
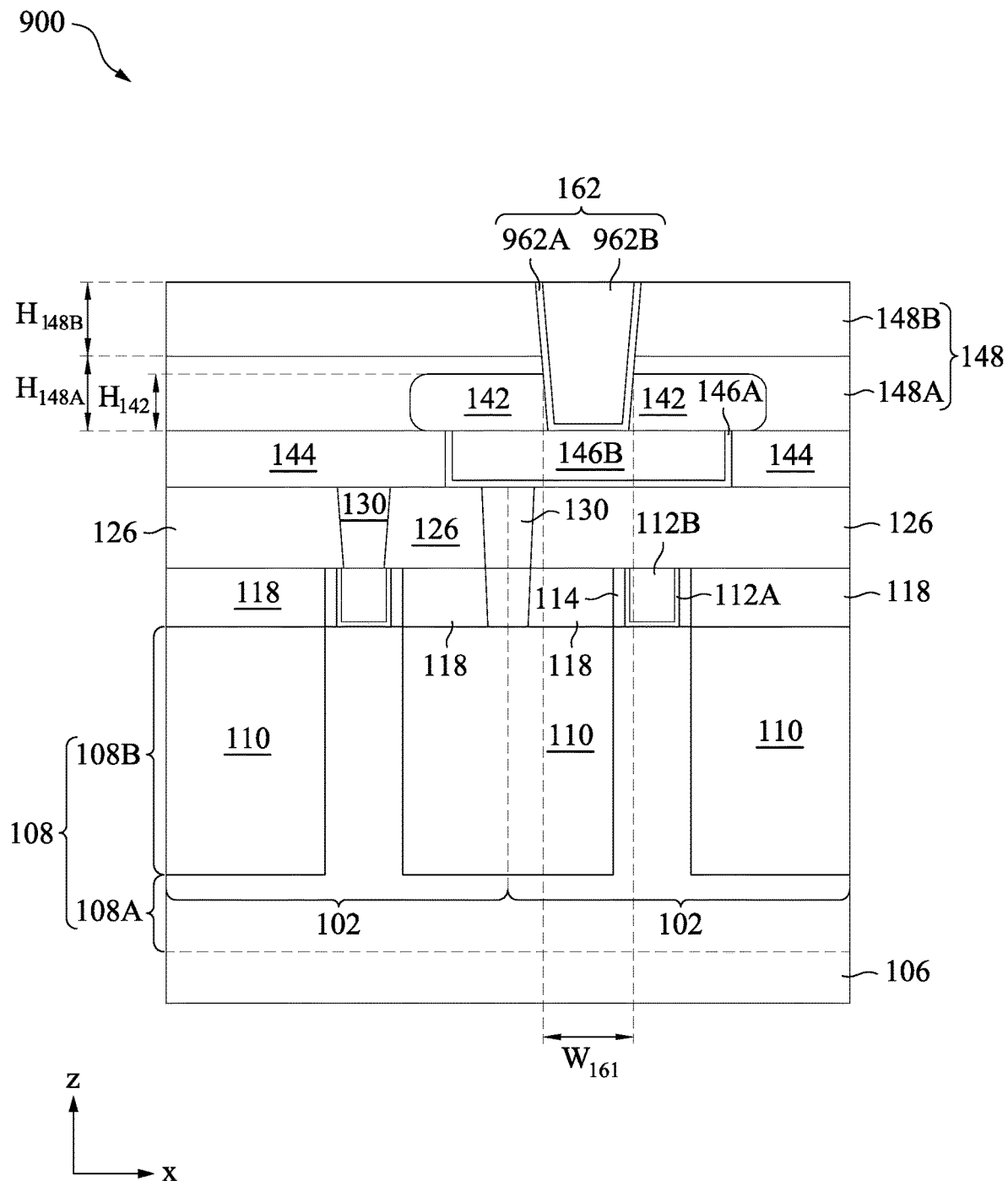

Referring to FIG. 8, a process for forming via 801 can include selectively removing intermixing layer 742 from conductive capping layer 142 using an etching process. In some embodiments, prior to the removal of intermixing layer 742, the process for forming via 801 can further include removing portions of layer of insulating material 148 under via 701 using the etching process. The etching process for forming via 801 can include a wet etching process, a dry etching process, or a combination thereof. The wet etching process can include using wet etchants that can dissolve intermixing layer 742. In some embodiments, the wet etchants can include an oxidizer, such as hydrogen peroxide. In some embodiments, a concentration of hydrogen peroxide can be from about 0.5% to about 8%. If the concentration is greater than 8%, it can increase difficulty to control the oxidation reaction. If the concentration is smaller than 0.5%, it can be insufficient to remove the intermixing layer. For example, intermixing layer 742 can include a compound of fluorine and cobalt (e.g., $CoF_x$), where the wet etching process can use hydrogen peroxide to dissolve the $CoF_x$ compound (e.g., intermixing layer 742) to form via 801 to expose the underlying layer of conductive material 146 (e.g., metal layer 146B). In some embodiments, the oxidizer for the wet etching process can further include nitric acid, sulfuric acid, bromine, or any other suitable oxidizer agents. In some embodiments, the wet etching process for forming via 801 can also include using DI water to dissolve intermixing layer 742. In some embodiments, the wet etching process for forming via 801 can further include using a DHF treatment, an APM treatment, a SPM treatment, or a combination thereof. The dry etching process for forming via 801 can include using a plasma dry etch associated with a gas mixture having $C_4F_8$, $CHF_3$, $CF_4$, $CH_2F_2$, Ar, $N_2$, $O_2$, $O_3$, He, $Cl_2$, or HBr.

In some embodiments, prior to removing intermixing layer 742, the process for forming via 801 can further include a dechuck process to enhance an etching efficiency of the etching process that removes intermixing layer 742. In some embodiments, the dechuck process can remove electrostatic charges on semiconductor device 700 (shown in FIGS. 7A-7C), and therefore can alter surface hydrophobicity of via 701. Accordingly, the etchant (e.g., hydrogen peroxide) of the etching process for removing intermixing layer 742 can be more efficiently transported through via 701 to react with intermixing layer 742. The dechuck process can be performed using a low density plasma. By way of example and not limitation, the low density plasma for the dechuck process can be generated under a pressure from about 3 mTorr to about 200 mTorr. In some embodiments, the low density plasma for the dechuck process can be generated at a power from about 10 Watts to about 1000 Watts. If the power is greater than 1000 Watts, it can introduce physical damage on semiconductor device 700 (shown in FIGS. 7A-7C). If the power is less than 10 Watts, it is insufficient to remove the electrostatic charge to alter surface hydrophobicity of via 701. Based on the disclosure herein, other methods for performing dechuck process may be within the spirit and scope of this disclosure.

Referring to FIG. 9, the filling of one or more conductive material layers can include (i) blanket depositing the one or more conductive material layers using a deposition process, and (ii) polishing the deposited one or more conductive material layers using a CMP process to form trench conductor layer 162 substantially coplanar with layer of insulating material 148. In some embodiments, the one or more conductive material layers can include a barrier liner layer 962A and a via conductor layer 962B. By way of example and not limitation, barrier liner layer 962A can include a metallic material (e.g., Ta or TiW), a metal oxide (e.g., alumina, manganese oxide, chromium oxide, niobium oxide, titanium oxide, or combinations thereof), a metal nitride (e.g. TaN or TiN), a metal compound (e.g., alumina, manganese oxide, chromium oxide, niobium oxide, titanium oxide, and/or combinations thereof), a carbon containing material, or combinations thereof. By way of example and not limitation, via conductor layer 962B can include Cu, Co, Ni, Ru, Rh, Ir, Os, Al, In, Ag, Au, W, or carbon nanotubes. In some embodiments, the deposition process for barrier liner layer 962A and via conductor layer 962B can include a CVD process, a PVD process, an ALD process, a plating process, or an ELD process.

Figure 10:
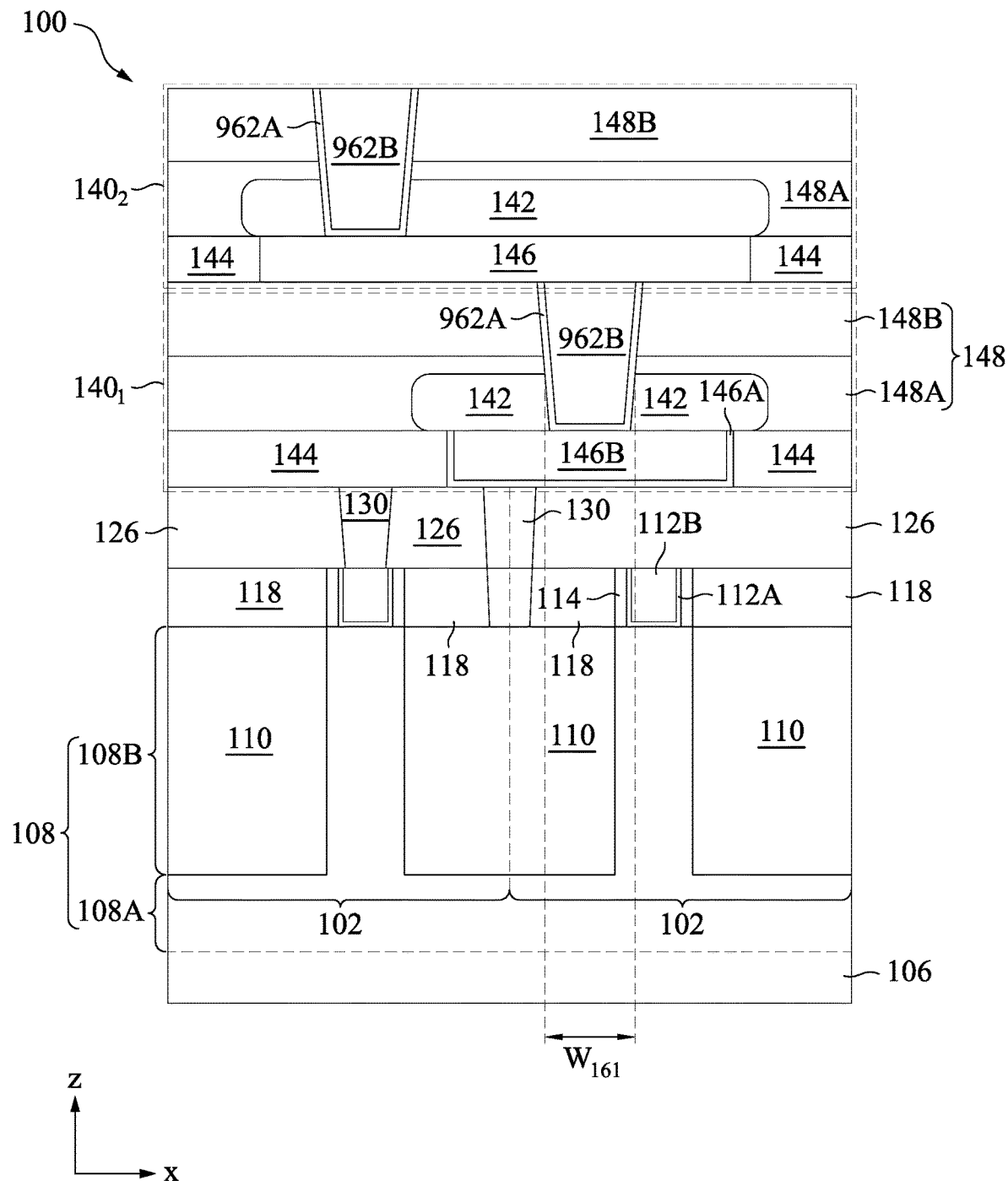

Referring to FIG. 2, in operation 225, another layer of conductive material can be formed over the layer of trench conductor. For example, as shown in FIG. 10, interconnect structure $140_2$'s layer of conductive material 146 can be formed over trench conductor layer 162 and layer of insulating material 148. A process for forming interconnect structure $140_2$'s layer of conductive material 146 can be similar to operation 210 as previously described. For example, the process for forming interconnect structure $140_2$ can include (i) blanket depositing one or more dielectric layers (e.g., interconnect structure $140_2$'s layer of insulating material 148) over semiconductor device 900 of FIG. 9 via a suitable deposition process, such as a CVD process, a PECVD process, a PVD process, and an ALD process, (ii) forming a via (not shown in FIG. 10) through the deposited dielectric layers to expose layer of interconnect structure $140_1$'s layer of conductive material 146 using a lithography process and an etching process, (iii) filling the via with one or more conductive materials, and polishing the one or more conductive materials using a CMP process.

Further, in operation 225, other components of interconnect structure $140_2$, such as interconnect structure $140_2$'s conductive capping layer 142, trench conductor layer 162, and layer of insulating material 148 can be formed over interconnect structure $140_2$'s layer of conductive material 146 using similar fabrication steps as previously described in operations 210, 215, and 220.

The present disclosure provides an exemplary interconnect structure and a method for forming the same. The interconnect structure can include a conductive wire layer, a layer of insulating material over the conductive wire layer, and a conductive capping layer embedded in the layer of insulating material and over the conductive wire layer. The interconnect structure can further include a trench conductor layer formed through the layer of insulating material and the conductive capping layer to physically contact the conductive wire layer. In some embodiments, the method of forming the trench conductor layer through the layer of insulating material and the conductive capping layer can include converting portions of the conductive capping layer to a fluorine-contained compound, removing the fluorine-contained compound to form a via through the conductive capping layer, and filling the via with one or more conductive materials. The interconnect structure can provide the benefit of a low resistance routing network while avoiding electromigration failure, thus enhancing performance and yield of the integrated circuit.

In some embodiments, a method for forming an interconnect structure can include forming a layer of conductive material over a substrate, forming a metallic capping layer over the layer of conductive material, forming a layer of insulating material over the metallic capping layer, forming a via within the layer of insulating material and the metallic capping layer, and filling the via with an other layer of conductive material.

In some embodiments, a method for forming an interconnect structure can include forming a fin structure on a substrate, forming a metal contact over the fin structure, forming a layer of conductive material over the metal contact, forming a metallic capping layer over the layer of conductive material, forming a layer of insulating material over the metallic capping layer, and forming a via in the layer of insulating material and the metallic capping layer to expose the layer of conductive material.

In some embodiments, an interconnect structure can include a substrate, a layer of conductive material over the substrate, a metallic capping layer over the layer of conductive material, a layer of insulating material over top and side surfaces of the metallic capping layer, and a layer of trench conductor formed in the layer of insulating material and the metallic capping layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an interconnect structure, comprising:
   forming a first layer of conductive material over a substrate;
   forming a first layer of insulating material substantially coplanar with the first layer of conductive material;
   forming a metallic capping layer by selectively growing the metallic capping layer over the first layer of conductive material while exposing the first layer of insulating material;
   forming a second layer of insulating material over the metallic capping layer;
   forming a via opening through the second layer of insulating material and the metallic capping layer; and
   filling the via opening with a second layer of conductive material.

2. The method of claim 1, wherein forming the metallic capping layer comprises selectively growing one or more of cobalt, ruthenium, tungsten, and combinations thereof over the first layer of conductive material.

3. The method of claim 1, wherein forming the second layer of insulating material comprises depositing the second layer of insulating material over a top surface and a side surface of the metallic capping layer.

4. The method of claim 1, wherein forming the second, layer of insulating material comprises depositing an aluminum nitride layer over the metallic capping layer, and wherein forming the via opening comprises:
   sputtering the aluminum nitride layer to form a catalyst;
   catalyzing, by the catalyst, a formation of an intermixing layer within the metallic capping layer; and
   removing the intermixing layer.

5. The method of claim 1, wherein forming the via opening comprises:
   forming a layer of halogen-containing compounds within the metallic capping layer; and
   removing the layer of halogen-containing compounds with an oxidizer.

6. The method of claim 1, wherein forming the via opening comprises removing electrostatic charges in the via opening with a dechuck process associated with a power between about 10 Watts and about 1000 Watts.

7. A method for forming an interconnect structure, comprising:
   forming a transistor structure on a substrate;
   forming a metal contact over the transistor structure;
   forming a layer of conductive material over the metal contact;
   forming a metallic capping layer over the layer of conductive material;
   forming a layer of insulating material over the metallic capping layer;
   forming a via opening through the layer of insulating material and the metallic capping layer to expose the layer of conductive material; and
   forming a barrier liner layer to contact the layer of conductive material and the metallic capping layer.

8. The method of claim 7, further comprising forming an other layer of insulating material over the transistor structure, wherein forming the metallic capping layer comprises selectively growing the metallic capping layer over the layer of conductive material while exposing the other layer of insulating material.

9. The method of claim 7, wherein forming the layer of insulating material comprises depositing the layer of insulating material over a top surface and a side surface of the metallic capping layer.

10. The method of claim 7, wherein forming the via opening comprises:
   forming the via opening in the layer of insulating material and over a portion of the metallic capping layer; and intermixing the portion of the metallic capping layer with one or more of fluorine, chlorine, bromine, carbon, oxygen, sulfur, phosphorus, nitrogen, and combinations thereof.

11. The method of claim 10, wherein forming the via opening further comprises removing the portion of the metallic capping layer with an oxidizer.

12. The method of claim 7, wherein the barrier liner layer comprises one or more of a metal, a metal oxide, a metal compound, a carbon-containing material, and combinations thereof.

13. A method, comprising:
forming a metallic capping layer over a first conductive layer;
depositing an insulating layer on the metallic capping layer;
removing a portion of the insulating layer with an etching process to expose a portion of the metallic capping layer;
reacting the portion of the metallic capping layer with the etching process to form an intermixing layer while catalyzing the formation of the intermixing layer with a sputtered material of the insulating layer;
removing the intermixing layer to form an opening, wherein the opening is through the insulating layer and the metallic capping layer; and
forming a second conductive layer in the opening and in contact with the first conductive layer.

14. The method of claim 13, wherein the etching process comprises a dry etch process using a halogen-containing plasma, and wherein reacting the portion of the metallic capping layer comprises:
penetrating the halogen-containing plasma through the metallic capping layer; and
forming the intermixing layer with a halogen of the halogen-containing plasma and a material of the metallic capping layer.

15. The method of claim 13, wherein reacting the portion of the metallic capping layer comprises forming an amorphized material of a crystalline material of the metallic capping layer.

16. The method of claim 1, wherein forming the metallic capping layer comprises extending the metallic capping layer over an edge of the first layer of conductive material.

17. The method of claim 1, wherein forming the metallic capping layer comprises selectively forming a layer of inhibitor over the first layer of insulating material.

18. The method of claim 14, wherein depositing the insulating layer comprises depositing an etch stop layer (ESL) over the metallic capping layer, and wherein reacting the portion of the metallic capping layer further comprises penetrating the halogen-containing plasma through the ESL.

19. The method of claim 1, further comprising forming a barrier liner layer in the via opening to contact the first layer of conductive material and the metallic capping layer.

20. The method of claim 13, further comprising forming a barrier liner layer in the opening to contact the metallic capping layer.

* * * * *